United States Patent
Lee et al.

(10) Patent No.: US 8,901,815 B2
(45) Date of Patent: Dec. 2, 2014

(54) ORGANIC LIGHT EMITTING DEVICE

(75) Inventors: Honyun Lee, Gyeonggi-do (KR); Changnam Kim, Seoul (KR); Seong Joong Kim, Anyang-si (KR); Honggyu Kim, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 122 days.

(21) Appl. No.: 13/079,664

(22) Filed: Apr. 4, 2011

(65) Prior Publication Data

US 2011/0175133 A1 Jul. 21, 2011

Related U.S. Application Data

(62) Division of application No. 11/764,300, filed on Jun. 18, 2007, now Pat. No. 7,918,705.

(30) Foreign Application Priority Data

Jun. 16, 2006 (KR) .................. 10-2006-0054577
Sep. 11, 2006 (KR) .................. 10-2006-0087709

(51) Int. Cl.
*H01J 1/66* (2006.01)
*H01L 51/00* (2006.01)
*H01L 51/52* (2006.01)
*H01L 51/56* (2006.01)

(52) U.S. Cl.
CPC ........ *H01L 51/0096* (2013.01); *H01L 51/0011* (2013.01); *H01L 51/52* (2013.01); *H01L 51/56* (2013.01); *Y02E 10/549* (2013.01)
USPC ........................................... 313/512

(58) Field of Classification Search
USPC .................... 313/498–512; 445/24
See application file for complete search history.

(56) References Cited

U.S. PATENT DOCUMENTS

| 5,742,129 A | 4/1998 | Nagayama et al. |
| 6,294,892 B1 | 9/2001 | Utsugi et al. |
| 2003/0020181 A1 | 1/2003 | Yamada |
| 2006/0050397 A1* | 3/2006 | Oh et al. ............... 359/619 |

FOREIGN PATENT DOCUMENTS

| KR | 10-2003-0071637 A | 9/2003 |
| KR | 10-2005-0079108 A | 8/2005 |
| KR | 10-2006-0035719 A | 4/2006 |

* cited by examiner

*Primary Examiner* — Anh Mai
*Assistant Examiner* — Brenitra M Lee
(74) *Attorney, Agent, or Firm* — Morgan, Lewis & Bockius LLP

(57) ABSTRACT

An organic light emitting device and a method of fabricating the same are disclosed. The organic light emitting device includes an opaque substrate having one or more holes, and an organic emissive unit interposed between first and second electrodes positioned on the opaque substrate.

10 Claims, 9 Drawing Sheets

ORGANIC LIGHT EMITTING DEVICE

The present patent application is a divisional patent application derived from the patent application Ser. No. 11/764,300 filed on Jun. 18, 2007 now U.S. Pat. No. 7,918,705, which claims the benefit of the Korean Patent Application No. 10-2006-0054577 filed on Jun. 16, 2006 and Korean Patent Application No. 10-2006-0087709 filed on Sep. 11, 2006, all of which are hereby incorporated by reference as if fully set forth herein.

BACKGROUND OF THE INVENTION

1. Field of the Invention

Exemplary embodiments relate to an organic light emitting device and a method of fabricating the same.

2. Discussion of the Related Art

The importance of flat panel displays has recently increased with the growth of multimedia. Various types of flat panel displays such as liquid crystal displays (LCDs), plasma display panels (PDPs), field emission displays (FEDs), organic light emitting devices have been put to practical use.

The organic light emitting device has rapid response time, low power consumption, and self-emission structure. Furthermore, the organic light emitting device has a wide viewing angle, so that it can excellently display a moving picture regardless of the size of the organic light emitting device. The organic light emitting device can be fabricated in low temperature environment using a simple fabrication process based on the existing semiconductor fabrication process. Hence, the organic light emitting device is attractive as a next generation display device.

Further, the organic light emitting device may be classified into a bottom emissive type device, a top emissive type device, and a dual emissive type device based on a traveling direction of light. The organic light emitting display device may be classified into a passive matrix type device and an active matrix type device based on a driving method.

A fabrication method of the organic light emitting device generally includes a patterning process of an anode electrode, a formation process of an insulating layer, a deposition process of an organic material and a cathode electrode, a formation process of a passivation layer, and an encapsulation process.

FIG. 1 schematically illustrates a process for aligning a substrate with a shadow mask in a related art organic light emitting device.

As illustrated in FIG. 1, an organic material is deposited on a substrate 140 using a shadow mask 130 inside a vacuum chamber 110. In the deposition of the organic material, a tolerance between the substrate 140 and the shadow mask 130 may be 50 11 m. This leads to the accurate deposition on the substrate 140.

The substrate 140 and the shadow mask 130 can be aligned by accurately fitting an alignment key (not shown) formed on the substrate 140 with an alignment key 131 formed on the shadow mask 130 using a window 150 of a deposition device and a camera 160 installed outside the deposition device.

Because the substrate 140 used to fabricate the organic light emitting device is generally a transparent glass substrate, the alignment key (not shown) formed on the substrate 140 and the alignment key 131 formed on the shadow mask 130 are aligned on an opposite surface to the surface of the substrate 140, on which the organic material is deposited, using the camera 160.

In other words, because the organic light emitting device has the transparent glass substrate 140, the substrate 140 and the shadow mask 130 are aligned on an opposite surface to the surface of the substrate 140, on which the organic material is deposited, using the camera 160.

However, a flexible display device employing flexible properties of a metal includes an opaque substrate. Therefore, an alignment key formed on the opaque substrate of the flexible display device cannot be seen using a camera.

Accordingly, it is difficult to see the alignment key formed on the opaque substrate in an alignment process of the flexible display device including the opaque substrate.

SUMMARY OF THE INVENTION

In one aspect, an organic light emitting device comprises an opaque substrate having one or more holes, wherein an area of an upper surface of the hole is larger than an area of a lower surface of the hole, and an organic emissive unit interposed between first and second electrodes positioned on the opaque substrate.

In another aspect, a method of fabricating an organic light emitting device comprises forming one or more holes passing through an opaque substrate and a first electrode on the opaque substrate to align the hole of the opaque substrate with a hole of a shadow mask inside a chamber provided with a source, wherein an area of an upper surface of the hole is larger than an area of a lower surface of the hole, forming an organic emissive unit on the first electrode using the source of the chamber, and forming a second electrode on the organic emissive unit.

In still another aspect, an organic light emitting device comprises an opaque substrate, a pixel unit positioned on the opaque substrate, a first pad electrically connected to the pixel unit, a first alignment key positioned at both sides of the first pad, a flexible substrate including a second pad electrically connected to the first pad, and a second alignment key positioned at both sides of the second pad, wherein the second alignment key has a center point at a location corresponding to a location of a center point of the first alignment key.

In yet still another aspect, a method of fabricating an organic light emitting device comprises forming a first alignment key at both sides of a first pad, that is electrically connected to a pixel unit formed on an opaque substrate, forming a second alignment key at both sides of a second pad formed at an edge of a flexible substrate electrically connected to the first pad, aligning the first pad with the second pad so that the location of the center point of the first alignment key corresponds to the location of the center point of the second alignment key, and electrically attaching the first pad to the second pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail embodiments of the invention examples of which are illustrated in the accompanying drawings.

Figure 1:
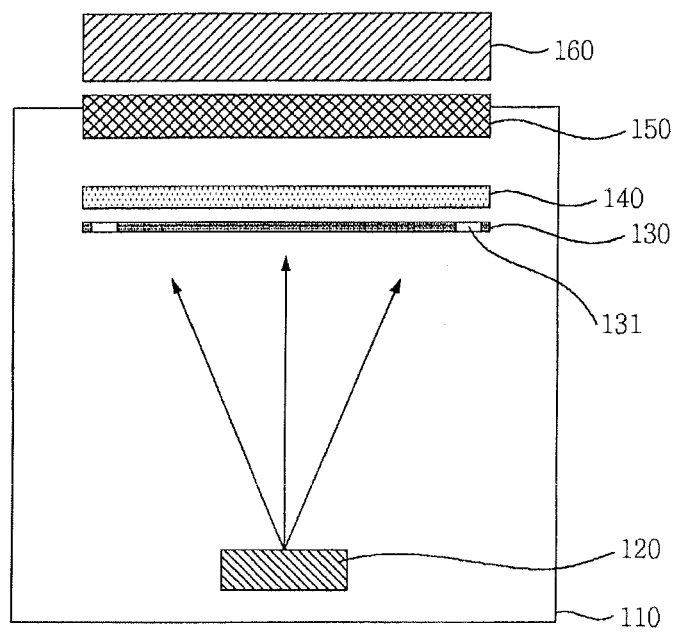
FIG. 1 schematically illustrates a process for aligning a substrate with a shadow mask in a related art organic light emitting device.
Figure 2:
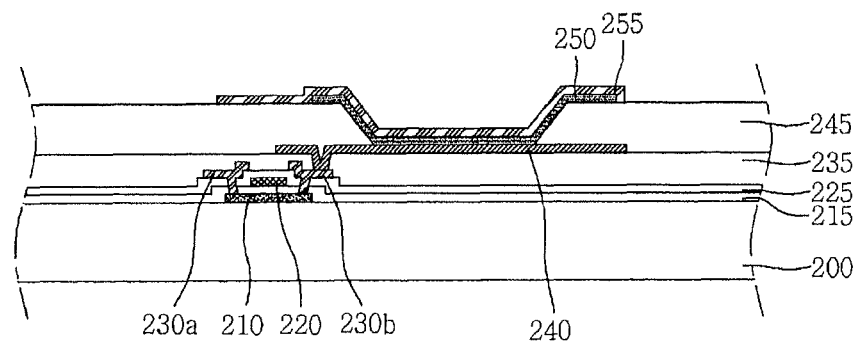
FIG. 2 is a cross-sectional view of an organic light emitting device.

FIG. 2 is a cross-sectional view of an organic light emitting device.

As illustrated in FIG. 2, a thin film transistor including a semiconductor layer 210, a gate insulating layer 215, a gate electrode 220, an interlayer insulating layer 225, a source electrode 230a, and a drain electrode 230b is positioned on a substrate 200.

A passivation layer 235 is positioned on the substrate 200 including the thin film transistor. A first electrode 240 is positioned to be electrically connected to the drain electrode 230b through the passivation layer 235. A bank layer 245 is positioned on the first electrode 240, and includes an opening exposing a portion of the first electrode 240. An emissive unit 250 including an emissive layer is positioned on the opening of the bank layer 245. A second electrode 255 is positioned on the emissive unit 250.

The emissive unit 250 may further include at least one of a hole injecting layer, a hole transporting layer, an electron injecting layer, or an electron transporting layer in addition to the emissive layer. The emissive layer is formed of an organic material in an embodiment. However, the emissive layer may be formed of an inorganic material.

The first and second electrodes 240 and 255 are electrically connected to data lines and scan lines formed on the substrate 200 to receive a data signal and a scan signal from a driving integrated circuit (IC). The emissive unit 250 emits light when the thin film transistor is driven by the data signal and the scan signal.

The organic light emitting device according to an embodiment is a bottom emissive type device. However, the organic light emitting device according to an embodiment may be applied to a top emissive type device or a dual emissive type device.

Figure 3:
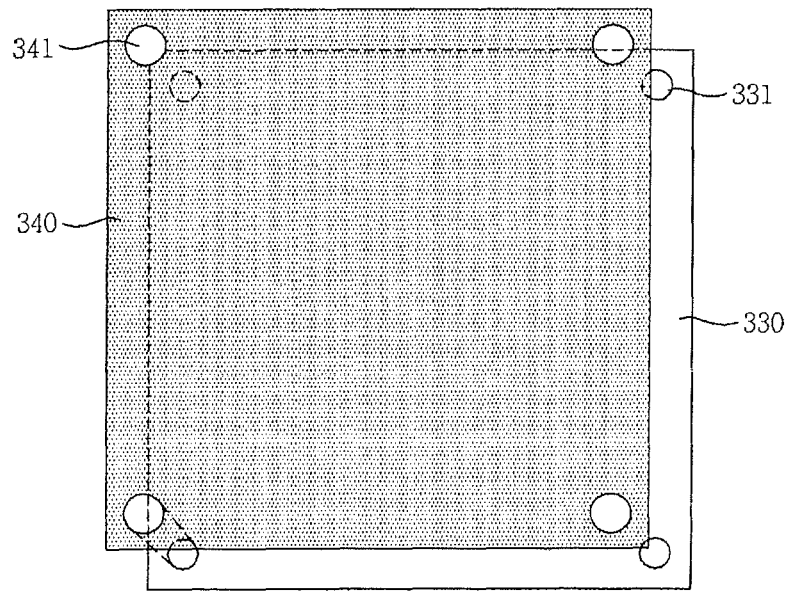
FIG. 3 illustrates a substrate and a shadow mask of an organic light emitting device according to a first exemplary embodiment.
Figure 4:
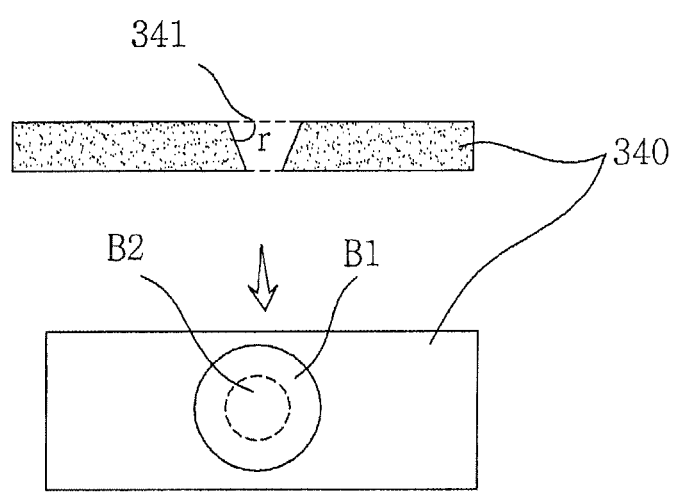
FIG. 4 illustrates an interior angle of a hole according to the first exemplary embodiment.
Figure 5:
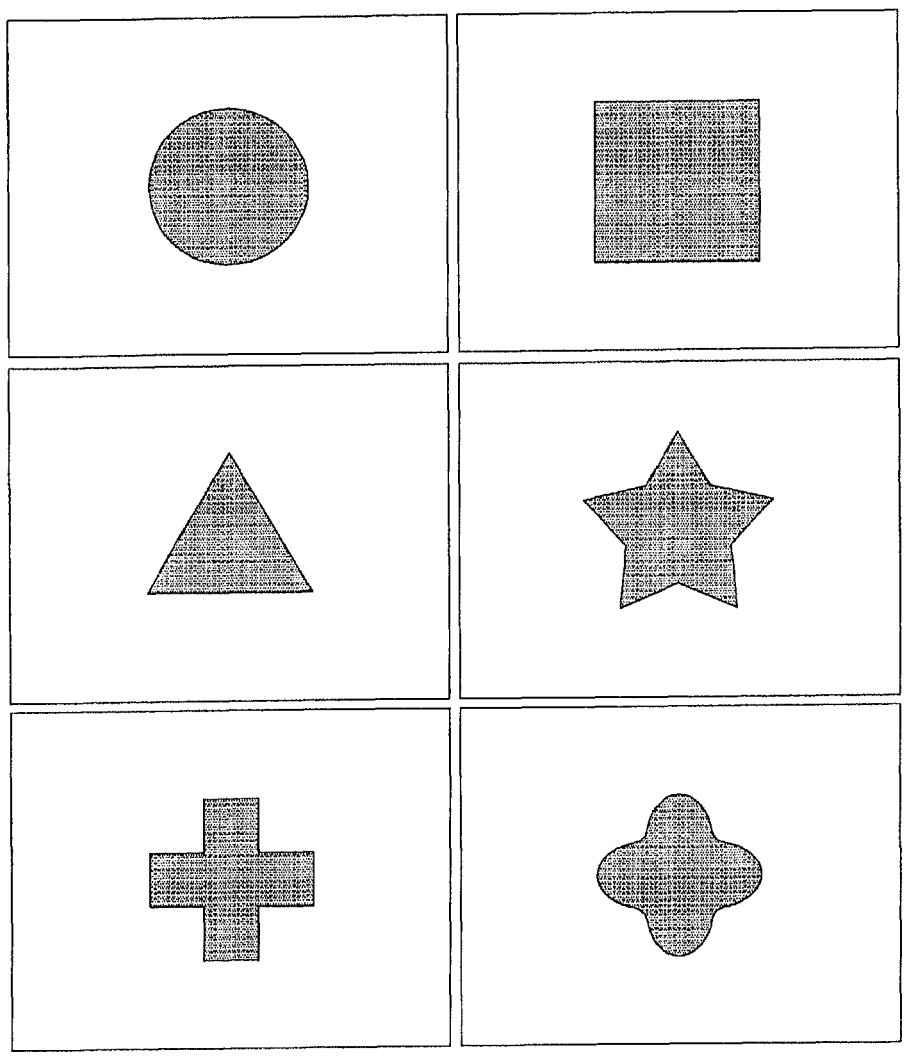
FIG. 5 illustrates various forms of the hole according to the first exemplary embodiment.

FIG. 3 illustrates a substrate and a shadow mask of an organic light emitting device according to a first exemplary embodiment, FIG. 4 illustrates an interior angle of a hole according to the first exemplary embodiment, and FIG. 5 illustrates various forms of the hole according to the first exemplary embodiment.

As illustrated in FIG. 3, the organic light emitting device according to the first exemplary embodiment includes a substrate 340 formed of an opaque material. The substrate 340 includes one or more holes 341. The substrate 340 may be a mother substrate.

The hole 341 of the substrate 340 is an alignment key used to align the hole 341 with a hole 331 formed on a shadow mask 330. The hole 341 of the substrate 340 may be formed at a location corresponding to the hole 331 of the shadow mask 330 or at each edge of the substrate 340. The size of the hole 341 may larger than the size of the hole 331. Accordingly, it is easy to align the substrate 340 with the shadow mask 330.

As illustrated in FIG. 4, an area B1 of an upper surface of the hole 341 passing through the substrate 340 may be larger than an area B2 of a lower surface of the hole 341. The hole 341 may have an inverted trapezoid-shaped vertical section. An angle (r) formed by the base (longer side) and the side of the hole 341 may be equal to or more than 50° and less than 90°. When the hole 341 is within the above range, the substrate 340 and the shadow mask 330 are aligned accurately. When the angle (r) of the hole 341 is equal to or more than 50°, the hole 341 of the substrate 340 and the hole 331 of the shadow mask 330 formed on the lower surface of the substrate 340 can be aligned easily.

As illustrated in FIG. 5, a shape of the hole 341 may be one of a circle, a cross, a triangle, a rectangular, a star, and a four-leaf clover. However, the shape of the hole 341 is not limited thereto. The hole 341 may have any shape as long as the hole 341 of the substrate 340 is easily aligned with the hole 331 of the shadow mask 330.

A reason fanning the hole 341 on the substrate 340 is to easily fabricate a flexible display device. Because a substrate of the flexible display device is formed of an opaque metal, it is difficult to align the opaque substrate with a shadow mask.

The substrate 340 may be formed of at least one of stainless steel, invar, titanium (Ti), molybdenum (Mo), or nickel (Ni).

Accordingly, the first exemplary embodiment provides the alignment key of the substrate 340 capable of being aligned with the alignment key of the shadow mask 330 by forming the hole 341 on the opaque substrate 340.

Figure 6:
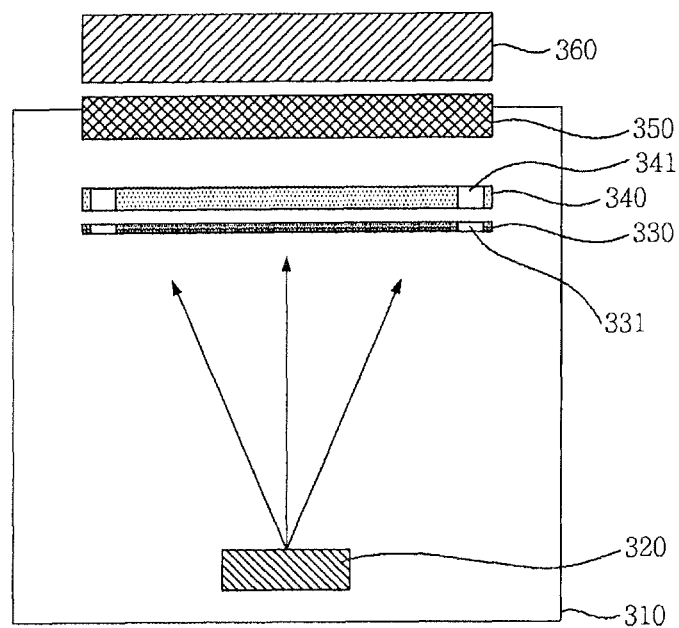
FIG. 6 schematically illustrates a process for aligning the substrate with the shadow mask according to the first exemplary embodiment.

FIG. 6 schematically illustrates a process for aligning the substrate with the shadow mask according to the first exemplary embodiment.

A method of fabricating the organic light emitting device according to the first exemplary embodiment may include a substrate aligning process, an emissive unit formation process, an electrode formation process, and an encapsulation process.

First, in the substrate aligning process, one or more holes 341 and a first electrode (not shown) are formed on the opaque substrate 340, and the holes 341 of the opaque substrate 340 and the hole 331 of the shadow mask 340 are aligned inside a chamber 310 provided with a source 320.

The holes 341 of the opaque substrate 340 and the hole 331 of the shadow mask 340 are observed using a window 350 of a deposition device and a camera 360 installed outside the deposition device, and thus the opaque substrate 340 and the shadow mask 340 can be aligned accurately.

Because the opaque substrate 340 may be applied to a flexible display device, the opaque substrate 340 may be formed of a sheet of 0.05 mm-3 mm thick including at least one of stainless steel, invar, Ti, Mo or Ni.

The opaque substrate 340 may be a mother substrate used to form the organic light emitting device.

The holes 341 is an alignment key used to align the opaque substrate 340 with the hole 331 of the shadow mask 340. A shape of the hole 341 may be one of a circle, a cross, a triangle, a rectangular, a star, and a four-leaf clover.

As described above, the area of the upper surface of the hole 341 may be larger than an area of a lower surface of the hole 341. The hole 341 may have an inverted trapezoid-shaped vertical section. The angle (r) formed by the base (longer side) and the side of the hole 341 may be equal to or more than 50° and less than 90°. The size of the hole 341 may larger than the size of the hole 331, so that the substrate 340 and the shadow mask 330 are aligned accurately.

Furthermore, the size of the hole 341 of the substrate 340 may smaller than the size of the hole 331 of the shadow mask 330. The shape of the hole 341 of the substrate 340 may not be the same as the shape of the hole 331 of the shadow mask 330.

The hole 341 may be formed using a chemical etching method or a laser beam method. However, the formation method of the hole 341 is not limited thereto.

In the emissive unit formation process, an organic emissive unit (not shown) is formed on the first electrode (not shown) using the source 320 of the chamber 310. The first electrode is formed of a material such as indium-tin-oxide on the substrate 340. An insulating layer (not shown) may provide electrical insulation between the first electrodes. The insulating layer may include an opening exposing a portion of the first electrode. The organic emissive unit may be formed inside the opening. The emissive unit is formed of an organic material in the first exemplary embodiment. However, the emissive unit may be formed of an inorganic material.

In the electrode formation process, a second electrode is formed of a material such as aluminum on the emissive unit. The second electrodes are spaced apart from each other on the emissive unit.

In the encapsulation process, the encapsulation process is performed to protect the components of the organic light emitting device. A driving integrated circuit (IC) is electrically connected to the components to complete the organic light emitting device.

The method of fabricating the organic light emitting device according to the first exemplary embodiment may further include a formation process of a driver electrically connected to the first electrode. Accordingly, one or more transistors and one or more capacitors electrically connected to the first electrode formed on the substrate 340 are driven due to the scan signal and the data signal, and thus, the emissive unit emits light.

The organic light emitting device according to the first exemplary embodiment may be applied to a bottom emissive type, a top emissive type or a dual emissive type.

Because a tolerance between the substrate and the shadow mask is as wide as ±200 11 m in the related art pin alignment method, it is difficult to fabricate the organic light emitting device of high resolution. However, since the hole 341 used as an alignment key is formed on the substrate 340 in the first exemplary embodiment, the organic light emitting device of high resolution can be fabricated.

Figure 7:
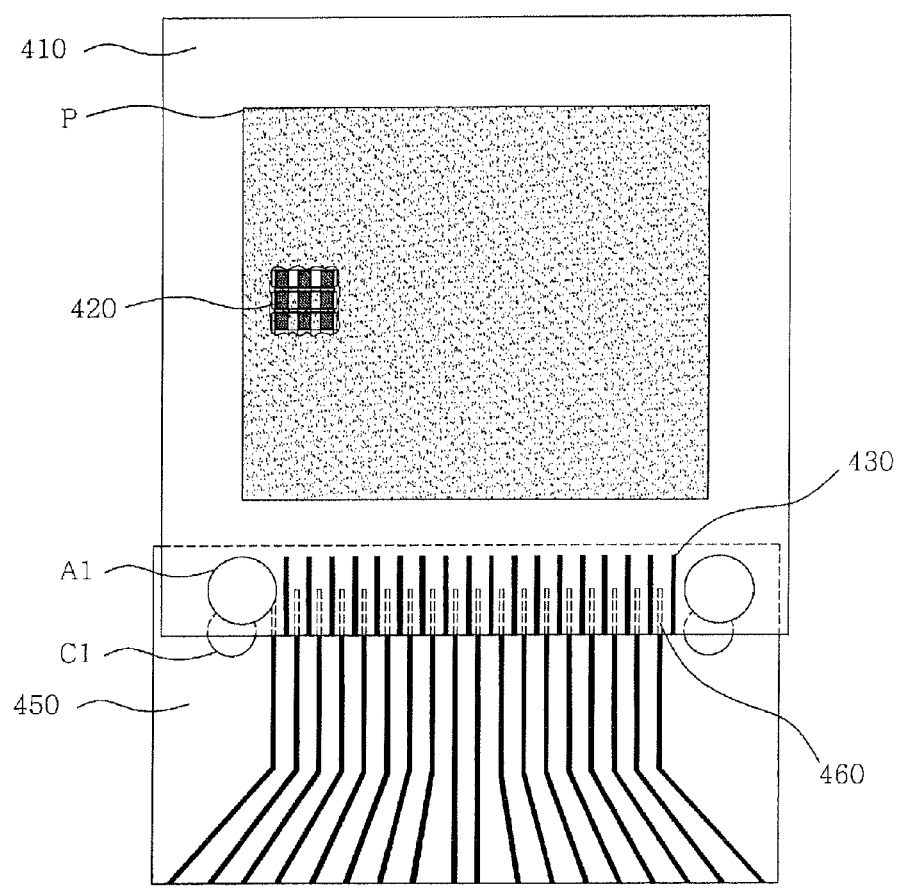
FIG. 7 is a plane view of an organic light emitting device according to a second exemplary embodiment.

FIG. 7 is a plane view of an organic light emitting device according to a second exemplary embodiment.

As illustrated in FIG. 7, a pixel unit P is positioned on an opaque substrate 410. The pixel unit P includes an emissive layer between two electrodes. The organic light emitting device according to the second exemplary embodiment may be a passive matrix type because the emissive layer emits light due to a driving signal supplied through a first pad 430. The organic light emitting device according to the second exemplary embodiment may be an active matrix type because the emissive layer emits light when a thin film transistor is driven by a driving signal supplied through the first pad 430.

The pixel unit P may be defined as an emissive area where a plurality of pixels are formed. Each pixel may include at least two emissive units 420 each emitting red, green and blue light. The emissive unit 420 may further include at least one of a hole injecting layer, a hole transporting layer, an electron injecting layer, or an electron transporting layer on or under the emissive layer. The emissive layer may be formed of an organic material or an inorganic material.

The first pad 430 is positioned at an edge of the opaque substrate 410, and a first alignment key A1 is positioned at both sides of the first pad 430. The first pad 430 is electrically connected to the pixel unit P.

The first pad 430 may include a data pad supplying a data signal to the pixel unit P, and a scan pad positioned at both sides of the data pad to supply a scan signal to the pixel unit P. The first alignment key A1 may be positioned at both sides of the scan pad.

The first alignment key A1 may be used as an alignment key in a deposition process for forming the emissive layer and a metal layer in the pixel unit P.

A flexible substrate 450 electrically connected to the first pad 430 may include a second pad 460. A second alignment key CI is positioned at both sides of the second pad 460 of the flexible substrate 450. The second alignment key CI has a center point at a location corresponding to a location of a center point of the first alignment key AI.

The first alignment key A1 may be formed in the form of hole. The hole of the first alignment key may have an inverted trapezoid-shaped vertical section. An angle formed by the base (longer side) and the side of the hole may be equal to or more than 50° and less than 90°.

The first and second alignment keys A1 and C1 may have the same shape. For example, the shape of the first and second alignment keys A1 and C1 may be one of a circle and a polygon such as a cross, a triangle, a rectangular, a star, and a four-leaf clover. However, the shape of the first alignment key A1 may be different from the shape of the second alignment key C1. The shape or size of the first and second alignment keys A1 and C1 is not limited thereto as long as the opaque substrate 410 is aligned with the flexible substrate 450 using the first and second alignment keys A1 and C1.

Figure 8:
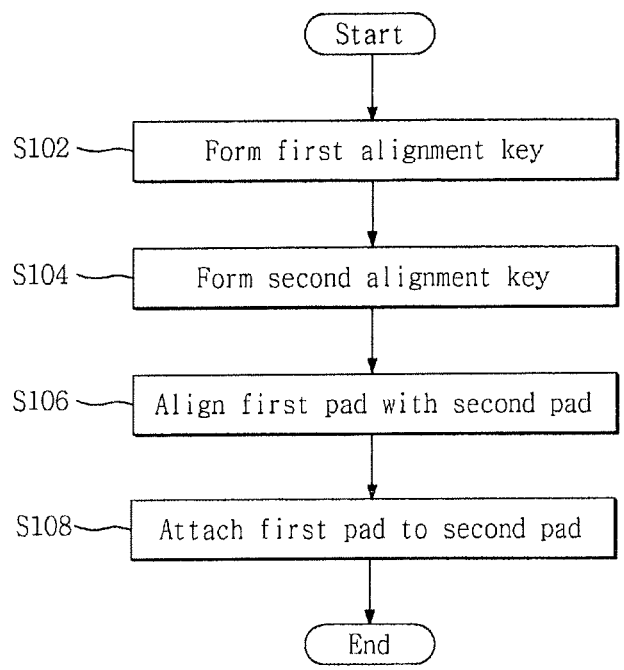
FIG. 8 is a flow chart of a fabrication method according to the second exemplary embodiment.

FIG. 8 is a flow chart of a fabrication method according to the second exemplary embodiment.

As illustrated in FIG. 8, in step S102, a first alignment key is formed at both sides of a first pad, that is formed at an edge of an opaque substrate and electrically connected to a pixel unit formed on the opaque substrate.

The pixel unit includes an emissive layer between two electrodes. The organic light emitting device may be a passive matrix type because the emissive layer emits light due to a driving signal supplied through the first pad. The organic light emitting device may be an active matrix type because the emissive layer emits light when a thin film transistor is driven by a driving signal supplied through the first pad.

The pixel unit may be defined as an emissive area where a plurality of pixels are formed. Each pixel may include at least two emissive units each emitting red, green and blue light. The emissive unit may further include at least one of a hole injecting layer, a hole transporting layer, an electron injecting layer, or an electron transporting layer on or under the emissive layer. The emissive layer may be formed of an organic material or an inorganic material.

The first pad may include a data pad supplying a data signal to the pixel unit, and a scan pad positioned at both sides of the data pad to supply a scan signal to the pixel unit. The first alignment key may be positioned at both sides of the scan pad.

The first alignment key A1 may be used as an alignment key in a deposition process for forming the emissive layer and a metal layer in the pixel unit.

Figure 9:
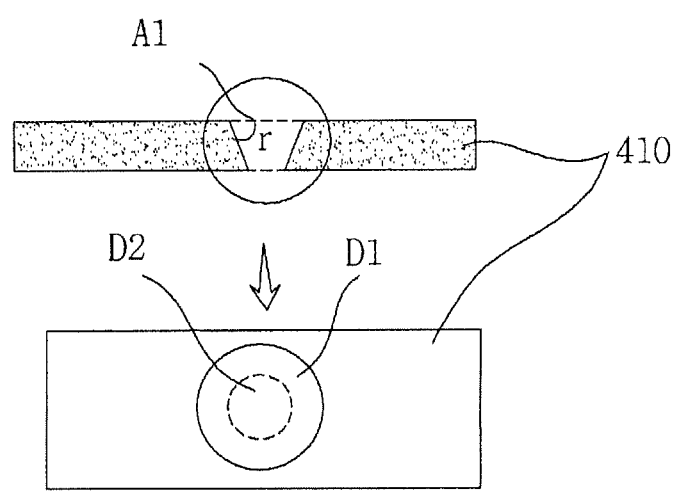
FIG. 9 illustrates a first alignment key according to the second exemplary embodiment.

FIG. 9 illustrates a first alignment key according to the second exemplary.

The first alignment key A1 of FIG. 9 may be formed using a chemical etching method or a laser beam method. However, the formation method of the first alignment key A1 is not limited thereto.

The first alignment key A1 may be formed in the form of hole. An area DI of an upper surface of the hole passing through the substrate 410 may be larger than an area D2 of a lower surface of the hole. The hole of the first alignment key may have an inverted trapezoid-shaped vertical section. An angle (r) formed by the base (longer side) and the side of the hole may be equal to or more than 50° and less than 90°.

When the angle (r) of the first alignment key A1 are equal to or less than 30°, it is necessary to more accurately control the dimension of the first alignment key A1. Therefore, fabrication yield decreases and fabrication cost increases. Accordingly, when the angle (r) of the first alignment key A1 is equal to or more than 50° and less than 90°, the productivity can be improved.

Figure 10:
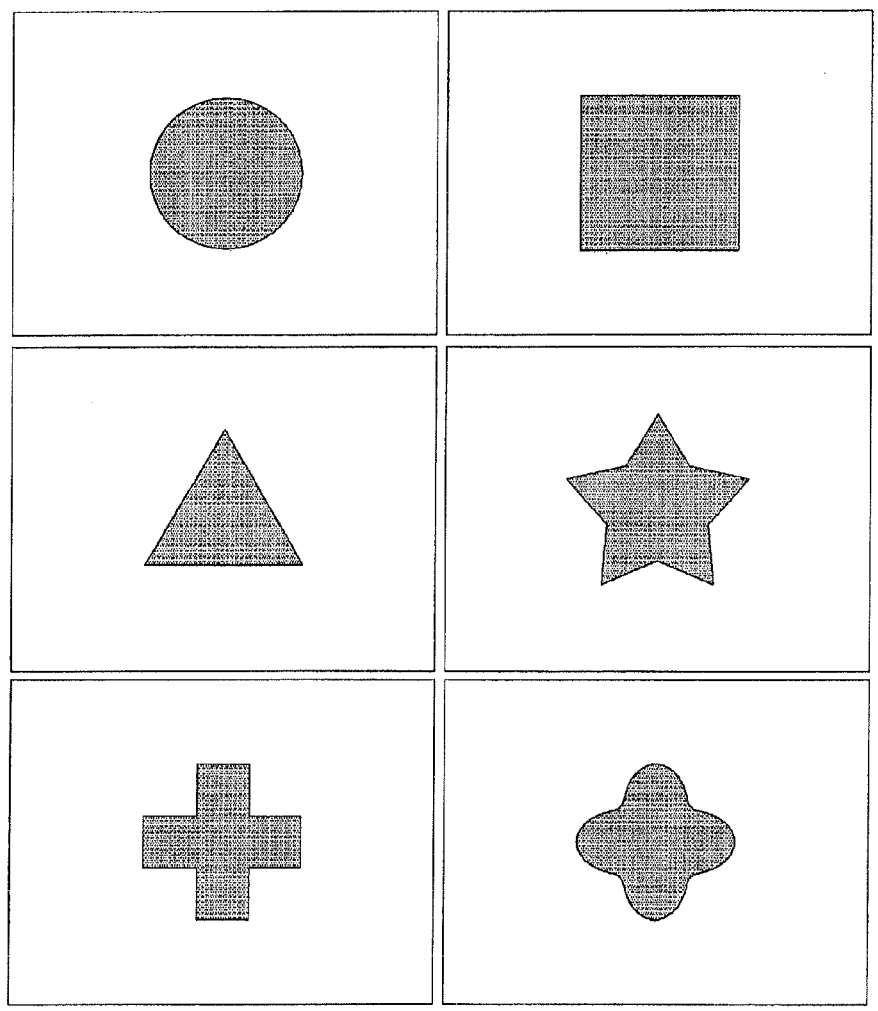
FIG. 10 illustrates a shape of the first alignment key according to the second exemplary embodiment.

FIG. 10 illustrates a shape of the first alignment key according to the second exemplary embodiment.

As illustrated in FIG. 10, the shape of the first alignment key A1 may be one of a circle and a polygon such as a cross, a triangle, a rectangular, a star, and a four-leaf clover.

In step S104 of FIG. 8, a second alignment key is formed at both sides of a second pad formed at an edge of a flexible substrate electrically connected to a first pad so that a location of a center point of the second alignment key corresponds to a location of a center point of the first alignment key.

A driving device is installed on the flexible substrate to supply a driving signal to the first pad formed in a pixel unit. It is important to connect the first pad positioned on the opaque substrate to the second pad positioned on the flexible substrate for electrical connection to the driving device. Accordingly, the second alignment key is formed at both sides of the second pad formed on the flexible substrate so that a location of a center point of the second alignment key corresponds to a location of a center point of the first alignment key.

The second pad may include a data pad supplying a data signal to the first pad, and a scan pad positioned at both sides of the data pad to supply a scan signal to the first pad. The second alignment key may be positioned at both sides of the scan pad.

The second alignment key may have the same shape as the first alignment key so that the first and second alignment keys are easily aligned. For example, the shape of the second alignment key may be one of a circle and a polygon such as a cross, a triangle, a rectangular, a star and a four-leaf clover.

However, the shape of the first alignment key may be different from the shape of the second alignment key. The shape or size of the first and second alignment keys is not limited thereto as long as the opaque substrate is aligned with the flexible substrate using the first and second alignment keys.

In step S106 of FIG. 8, the first pad and the second pad are aligned so that a location of a center point of the first alignment key corresponds to a location of a center point of the second alignment key.

In step S108 of FIG. 8, the first pad is electrically attached to the second pad. Furthermore, a conductive adhesive such as anisotropic conductive film (ACF) may be used in the electrical attachment of the first and second pads. Next, the driving device installed in the flexible substrate supplies a driving signal to the first and second pads.

As described above, in the organic light emitting device and the method of fabricating the same, when the components of the organic light emitting device are fabricated and then a tape automated bonding (TAB) process is performed, it is easy to arrange a flexible printed circuit (FPC) or a chip-on-film (COF) contacting the opaque substrate.

The opaque substrate may be formed of at least one of stainless steel, invar, Ti, Mo, or Ni. Furthermore, the opaque substrate may be formed of a sheet of 0.05 mm-3 mm thick.

As above, in the organic light emitting device and the method of fabricating the same according to the exemplary embodiments, the organic light emitting device of high-resolution having the fine electrode pads can be easily connected to an external circuit by forming the alignment key on the opaque substrate. Furthermore, proportion defective of the organic light emitting device that may occur during the TAB process is reduced, and thus, fabricating yield of the organic light emitting device increases.

The exemplary embodiments have described the process for aligning the opaque substrate with the shadow mask or the flexible substrate by forming the hole-shaped alignment key on the opaque substrate. However, the exemplary embodiments may be applied to a process for aligning the opaque substrate with a chip-on-glass type driving integrated circuit by forming the hole-shaped alignment key on the opaque substrate.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An organic light emitting device comprising:
   an opaque substrate having more than one hole, wherein an area of an upper surface of the holes passing through the opaque substrate is larger than an area of a lower surface of the holes; and
   an organic emissive unit interposed between first and second electrodes formed on the opaque substrate,
   wherein the holes are formed at only each edge of the opaque substrate in the form of through holes and have an inverted trapezoid-shaped vertical section.

2. The organic light emitting device of claim 1, wherein a shape of each of the holes is one of a circle, a cross, a triangle, a rectangle, a star, and a four-leaf clover.

3. The organic light emitting device of claim 1, wherein an angle formed by the base (longer side) and the side of each of the holes is equal to or more than 50° and less than 90°.

4. The organic light emitting device of claim 1, wherein the holes of the opaque substrate are used to align the opaque substrate with a shadow mask, and the size of one of the holes of the opaque substrate is larger than the size of a hole of the shadow mask.

5. The organic light emitting device of claim 1, wherein the opaque substrate is formed of at least one of stainless steel, invar, titanium (TI), molybdenum (Mo), or nickel (Ni).

6. The organic light emitting device of claim 1, further comprising a driver electrically connected to the first electrode.

7. An organic light emitting device comprising:
   an opaque substrate;
   a pixel unit formed on the opaque substrate;
   a first pad electrically connected to the pixel unit;
   first alignment keys positioned at both sides of the first pad and passing through the opaque substrate, wherein an area of an upper surface of the first alignment keys passing through the opaque substrate is larger than an area of a lower surface of the first alignment keys;

a flexible substrate including a second pad electrically connected to the first pad; and second alignment keys positioned at both sides of the second pad, wherein each of the second alignment keys has a center point at a location corresponding to a location of a center point of each of the first alignment keys, wherein the first alignment keys are formed at only each edge of the opaque substrate in the form of through holes and have an inverted trapezoid-shaped vertical section.

8. The organic light emitting device of claim 7, wherein an angle formed by the base (longer side) and the side of each of the holes is equal to or more than 50° and less than 90°.

9. The organic light emitting device of claim 7, wherein the first and second alignment keys each have one of a circle and a polygon.

10. The organic light emitting device of claim 7, wherein the pixel unit includes an organic emissive layer formed between two electrodes, and the organic emissive layer emits light when a thin film transistor is driven by a driving signal supplied through the first pad.

\* \* \* \* \*